United States Patent [19]

Ezell

[11] Patent Number: 5,594,408

[45] Date of Patent: Jan. 14, 1997

[54] POTENTIOMETER

[75] Inventor: Richard W. Ezell, Carrollton, Tex.

[73] Assignee: Dallas Semiconductor, Dallas, Tex.

[21] Appl. No.: 497,490

[22] Filed: Jun. 30, 1995

[51] Int. Cl.⁶ .................................................. H01C 10/04
[52] U.S. Cl. ............................ 338/89; 381/106; 257/538
[58] Field of Search ................................. 338/17, 89, 92, 338/198, 200, 201, 309, 384; 257/538; 381/102, 106

[56] References Cited

U.S. PATENT DOCUMENTS

| | | | |
|---|---|---|---|
| 4,016,483 | 4/1977 | Rudin | 338/92 |
| 4,260,947 | 4/1981 | Masseyq | 323/322 |
| 4,385,204 | 5/1983 | Wine | 179/1 VL |
| 4,567,425 | 1/1986 | Bloomer | 323/237 |
| 4,764,717 | 8/1988 | Tucker et al. | 323/364 |
| 5,218,225 | 6/1993 | Zanders | 257/538 |
| 5,245,668 | 9/1993 | Kirchlechner | 381/102 |
| 5,345,422 | 9/1994 | Redwine | 365/189.90 |
| 5,406,636 | 4/1995 | Yamada et al. | 381/106 |

OTHER PUBLICATIONS

Crystal Semiconductor Corporation, *Crystal Semiconductor Corporation, CS3310, Stereo Digital Volume Control*, Mar. 1993, pp. 1–11.

Dallas Semiconductor Corporation, *System Extension Data Book*, "DS1802, Dual Audio Taper Potentiometer with Pushbutton Control," 1994–1995, pp. 217–230.

Dallas Semiconductor Corporation, "DS1869, 3V Dallastat™ Electronic Digital Rheostat, " Apr. 21, 1994, pp. 1–7.

Toshiba, *TC9153AP, TC9154AP*, pp. 1–15.

*Primary Examiner*—Tu Hoang
*Attorney, Agent, or Firm*—Jenkens & Gilchrist

[57] ABSTRACT

A digital potentiometer adapted for and connected to and interacting directly with a plurality of external switches. Specifically, the various wiper points of a semiconductor resistor array are selected, for each channel of an audio amplification device according to various switch selections. The method and apparatus disclosed also makes priority determinations if more than one external switch is selected at the same time according to which switch was selected first.

2 Claims, 6 Drawing Sheets

POTENTIOMETER

BACKGROUND OF THE INVENTION

1. Technical Field of the Invention

The present invention relates generally to circuits which produce resistance and, more particularly, to integrated circuits which provide a selectable resistance value or selectable amount of gain and which are specially adapted for utilization with audio devices.

2. Description of Related Art

Accordingly, the use of digital potentiometers in audio circuits is becoming increasingly popular. However, most digital potentiometers do not, at their front end, have the capability of directly connecting to a switch on a panel, for example of a stereo. While mechanical potentiometers are generally mounted directly on a stereo panel, and then connected to an amplifier, most digital potentiometers do not have the capability of directly communicating with the switches of a front panel of an audio system. One common way to interface digital potentiometers to such switches is through the use of a software controlled microprocessor.

SUMMARY OF THE INVENTION

The present invention is directed to a digital potentiometer having a plurality of cells of resistors and a plurality of wiper points located between the cells of resistors wherein a multiplexer is used to select a given wiper point. Additionally, the invention is directed to a potentiometer which comprises a circuit for debouncing the signals produced by a switch and a processing unit adapted for controlling the multiplexer which, in turn, activates the gate devices which select the various wiper points, which then define the level of resistance or the amount of gain provided.

BRIEF DESCRIPTION OF THE DRAWINGS

Other advantages and novel features of the present invention will become apparent from the following detailed description of the invention when considered in conjunction with the accompanying drawings in which.

DETAILED DESCRIPTION OF THE PRESENTLY PREFERRED EXEMPLARY EMBODIMENTS

Figure 1:
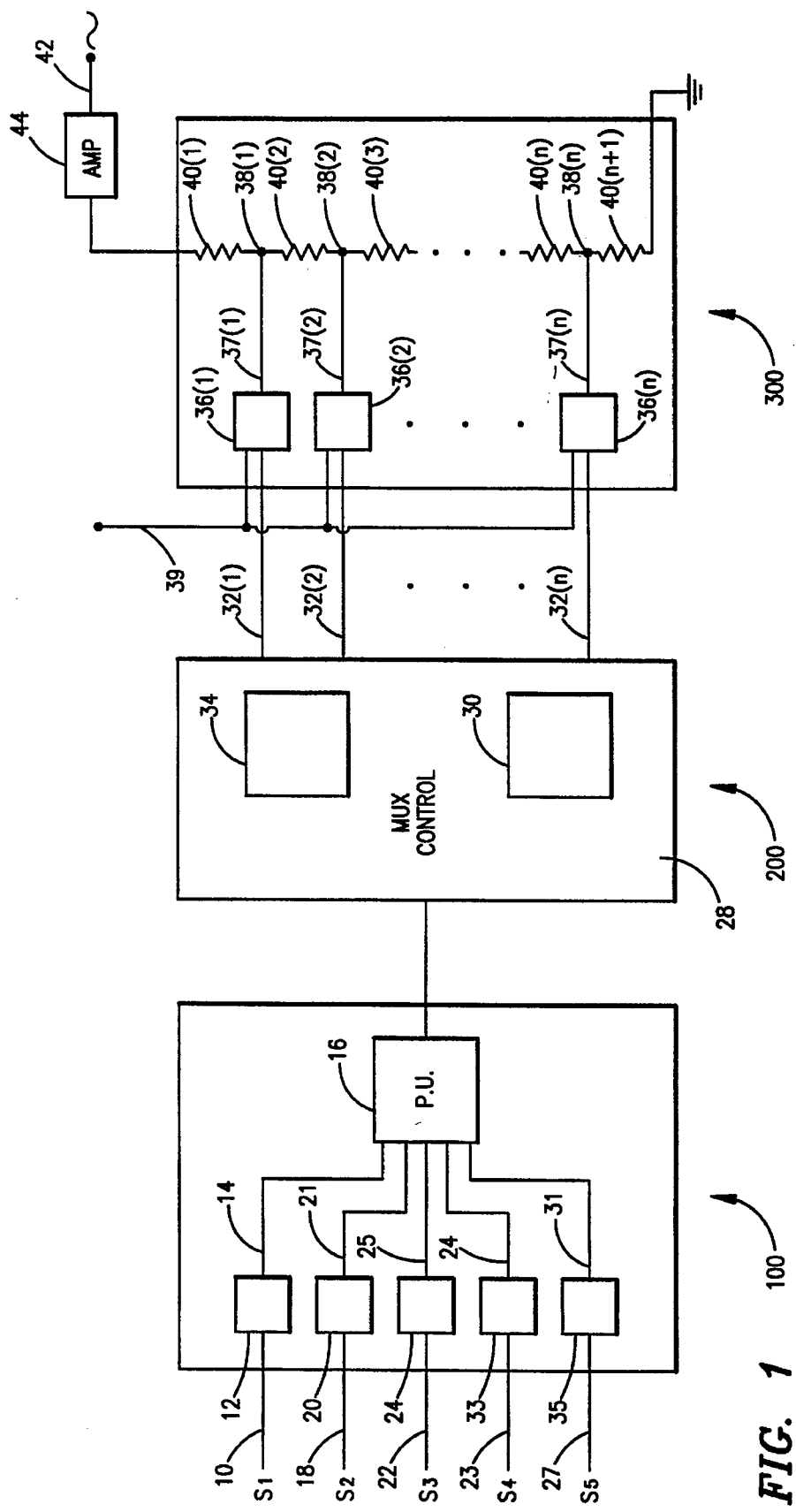
FIG. 1 is a block diagram demonstrating a system overview comprising the invention.
Figure 2:
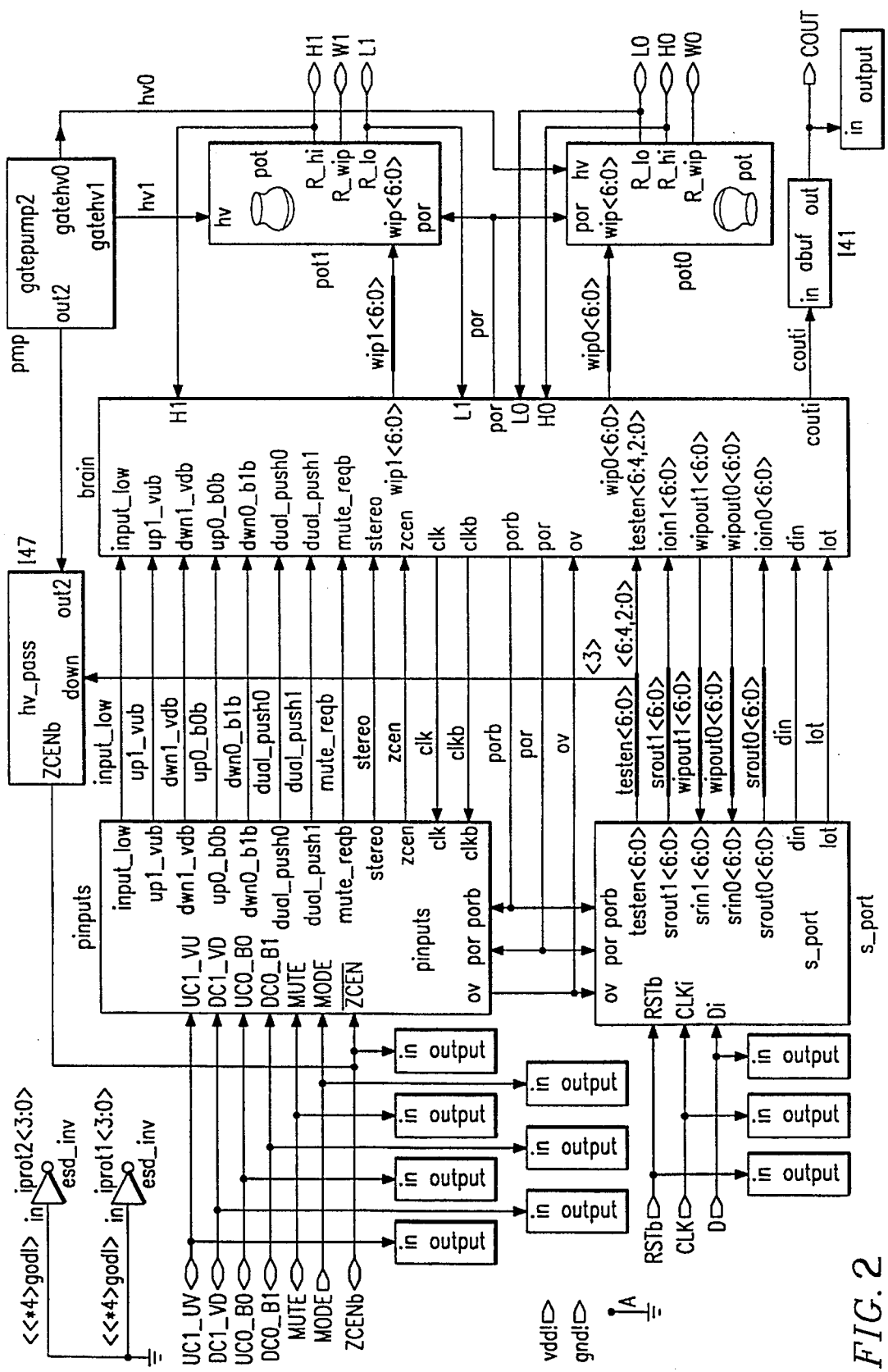
FIG. 2 is a schematic representing the block diagram of the embodiment.
Figure 3:
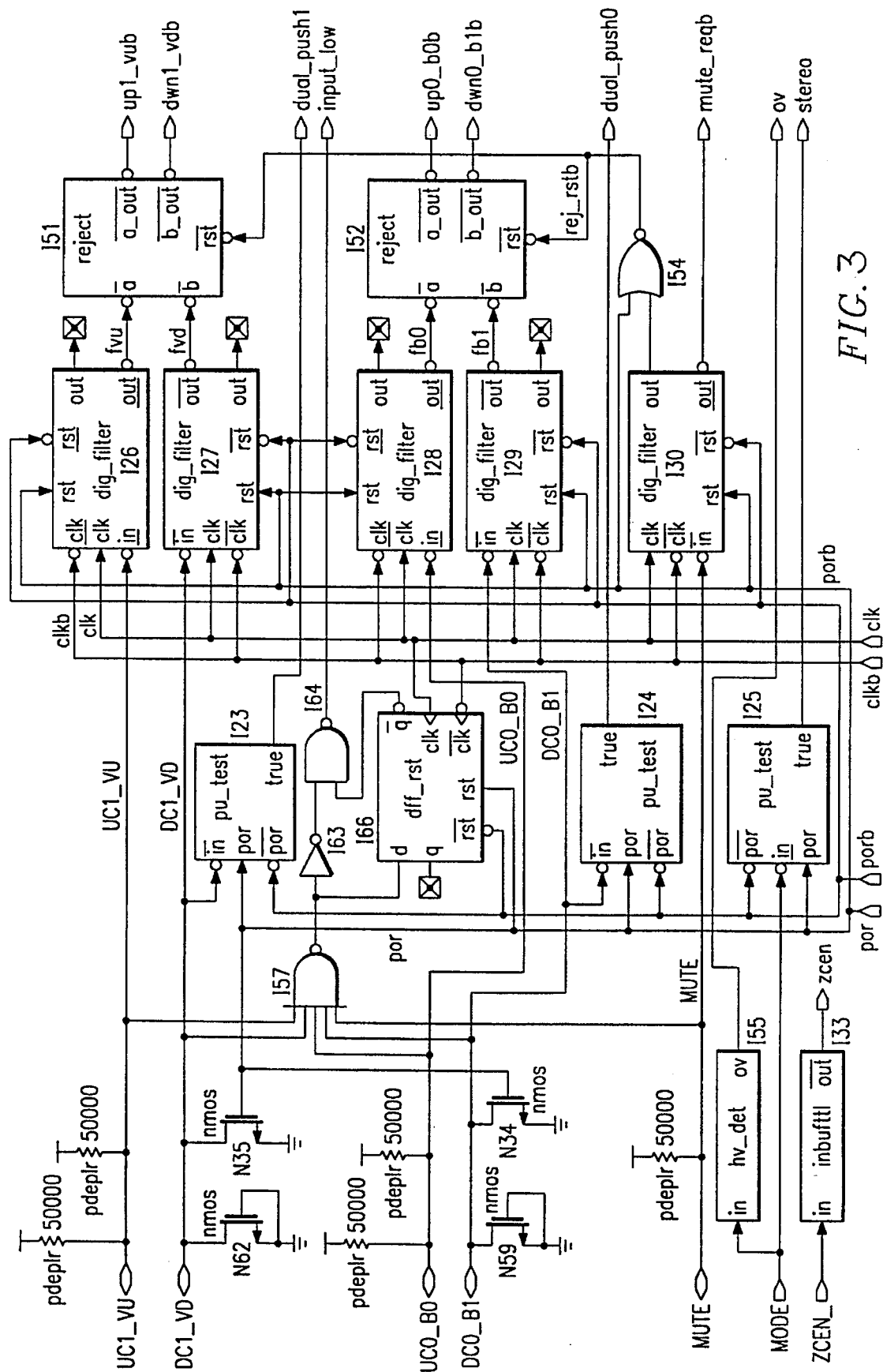
FIG. 3 represents the block diagram of the push button debounce circuitry.
Figure 4:
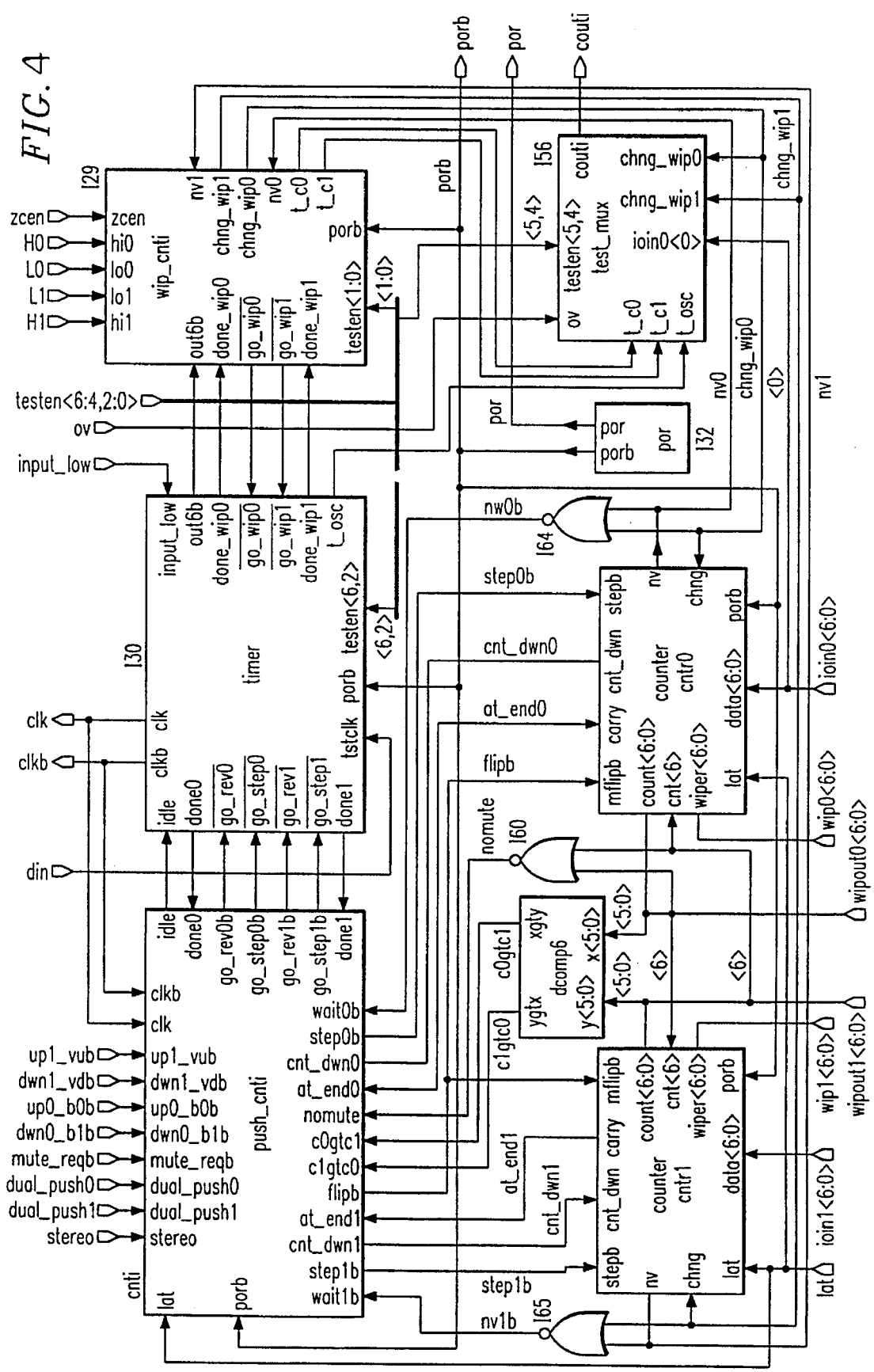
FIG. 4 is a diagram of the central control logic for one embodiment of the invention.
Figure 5:
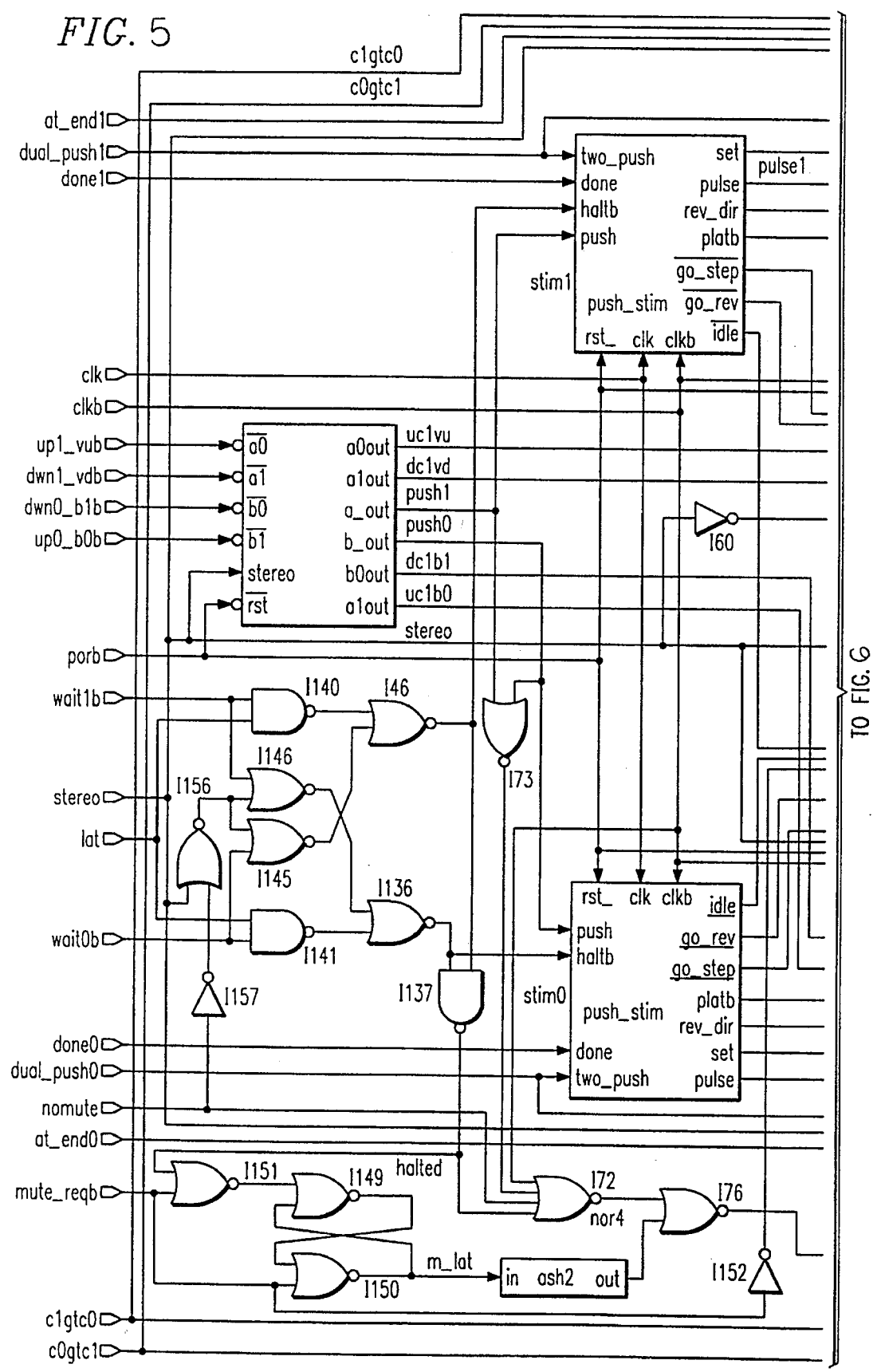
FIGS. 5 and 6 in combination represent the control circuitry for push button operation for one embodiment of the invention.
Figure 6:
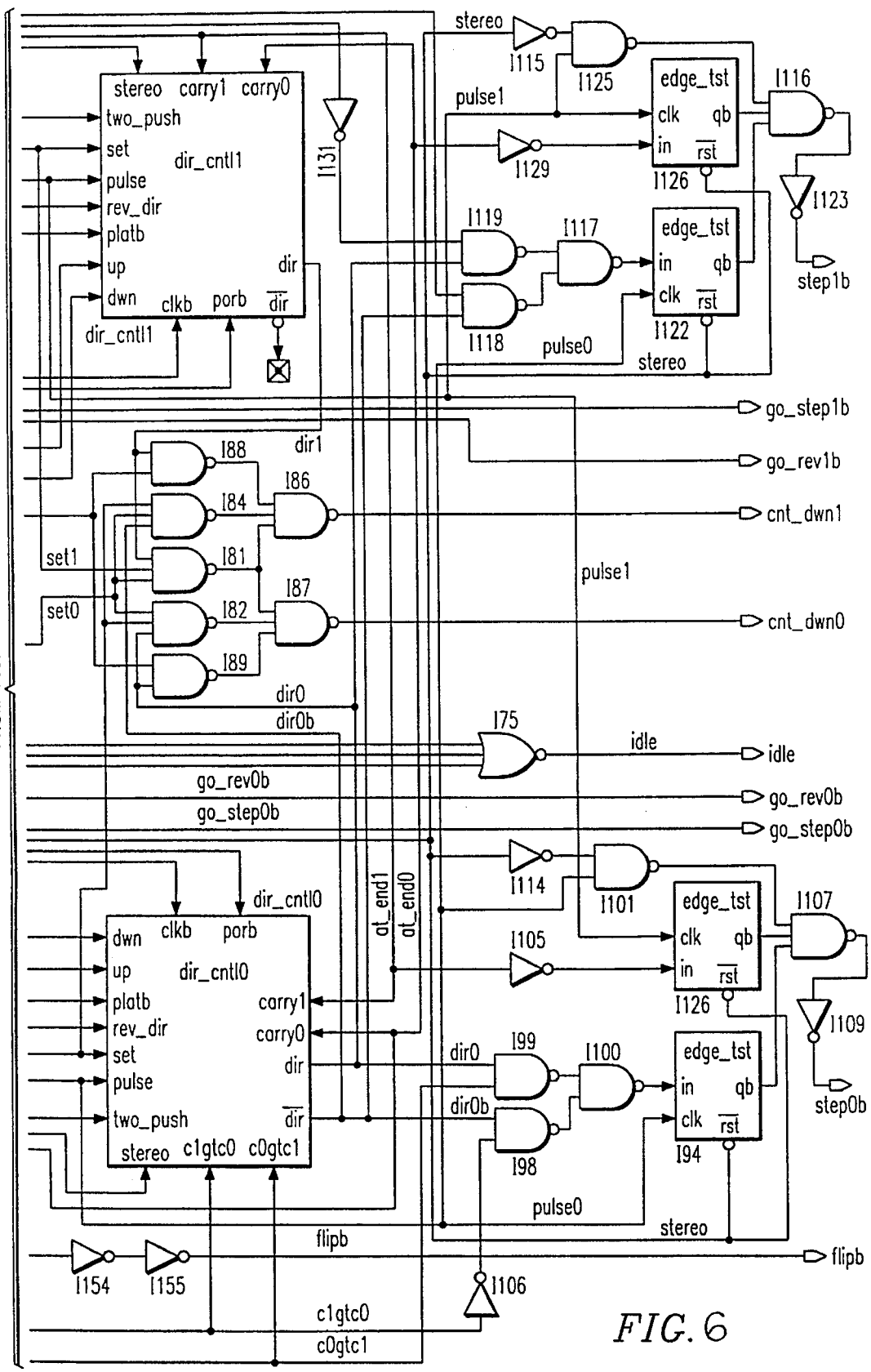

Referring now to FIG. 1 there is shown a block diagram of the system comprising the invention. Depicted in FIG. 1 is a series of blocks all forming a part of the digital potentiometer of this invention. As may be seen, block 100, which contains circuitry adapted for communicating with external switches, is connected to block 200 which contains circuitry for controlling the semiconductor gates of block 300 which, in turn, interface with the resistor chain of the potentiometer. Thus, a digital potentiometer which is fully capable of being directly connected between external switches and an amplifier is provided.

More specifically, still referring to FIG. 1, an external switch $S_1$ is connected by line 10 to a debounce circuit 12 which is within block 100. The debounce circuit 12 is a conventional debounce circuit which reads and interprets the open/close state of external switch $S_1$ and thereafter produces a signal which reflects the state of the external switch $S_1$ over line 14 to a processing unit 16. Processing unit 16 is adapted for analyzing external switch selections to determine, for each of a plurality of channels, whether the corresponding resistance of the corresponding digital potentiometer should be increased or decreased according to whether volume is to be increased, decreased, or muted for that channel. Similarly, a plurality of other switches $S_2 \ldots S_n$, are also connected to a processing unit 16 in a similar manner. Therefore, as is shown in FIG. 1, a switch $S_2$ is connected over line 18 to a debounce circuit 20 which is in turn connected to the processing unit over line 21. Switch $S_3$ is connected over line 22 to debounce circuit 24 which is in turn connected to processing unit 16 over line 25. In one embodiment, for example, $S_1$ could represent that an increase in volume is being selected, $S_2$ represents that a-decrease in volume is being selected, $S_3$ represents Balance Left, $S_4$ represents Balance Right, and $S_5$ represents a mute control. Other controls for equalization or tone control could likewise be employed.

Processing unit 16 contains a circuit for interpreting the state of the external switches and an order of selection. More specifically, processing unit 16 continuously monitors lines 14, 21, 25, 29, and 31 from debounce circuits 12, 20, 24, 33 and 35 to determine for example whether an adjustment in volume is being selected. Additionally, if two or more adjustments are being selected, then processing unit 16 determines which adjustment was selected first and responds according to that selection while ignoring the other selections so long as two or more selections are being made at once. Once processing unit 16 determines that only one selection is being made, then the processing unit 16 will respond in a normal fashion.

The invention also comprises a method for adjusting the volume of a digital potentiometer through the use of external switches. Processing unit 16 analyzes each of the signals received from $S_1$ through $S_5$ via lines 14, 21, 25, 29, and 31, respectively, to determine whether a volume adjustment has been requested by depression of an external push button switch. Specifically, processing unit 16 determines whether $S_1$ was depressed as indicated from debounce circuit 12 over line 14 that an increase in volume is desired. Similarly, processing unit 16 determines whether $S_2$ was depressed indicating that a decrease in volume is desired, whether $S_3$ is depressed indicating that balance should be shifted to the left channel or $S_4$ indicating that balance should be shifted to the right. Processing unit 16 also determines if $S_5$ has been depressed indicating that a mute function has been selected.

If either an increase or decrease in volume has been selected as indicated by depression of $S_1$ or $S_2$ as reflected upon lines 10 or 18, processing unit 16 will decrease or increase the attenuation of the digital potentiometer for each channel accordingly in a manner which maintains the relative difference in attenuation of the channels as previously set by a balance operation.

However, if $S_3$ has been depressed, as indicated by a signal on line 22, then processing unit 16 responds by changing the attenuation of the digital potentiometer for the right channel to decrease the volume produced by the right channel if the volume of the right channel is equal to or less than the left channel. If the volume of the right channel is greater than the left channel, then the volume of the left channel is increased until the channel volumes are equal. Once equal, the right channel volume is lowered so long as $S_3$ is depressed. It is worth noting that volume is decreased by increasing attenuation and vice-versa. The balance control operation to change the balance for the right channel is the same as described above for the left channel. However, if $S_4$ has been depressed, as indicated by a signal on line 22, then processing unit 16 responds by changing the attenuation of the digital potentiometer for the left channel to decrease the volume produced by the left channel if the volume of the left channel is equal to or less than the right channel. If the volume of the left channel is greater than the right channel, then the volume of the right channel is increased until the channel volumes are equal. Once equal, the left channel volume is lowered so long as $S_4$ is depressed.

Finally, if $S_5$ has been so depressed indicating over line 27 that mute has been selected, then processing unit 16 will select maximum attenuation so long as mute is selected. Once mute is deselected, the previous attenuation levels are restored.

In accordance with this interpretation of the signal selections, the processing unit 16 sends commands over line 26 to a multiplexer control 28 located in block 200 to activate the multiplexer 200 and to select the resistive value produced by the potentiometer resistor array of block 300. The circuit for interpreting the commands of produced by the processing unit 16 may, for example, be digital circuitry or in the form of a microprocessor under software control or a combination thereof.

While the logic and circuitry of processing unit 16 will vary widely according to the devices with which it is being interfaced, in one embodiment utilizing the invention herein, the external switches represent push button switches for a consumer stereo. For example, switch $S_1$ and $S_2$ might represent a volume selection while switches $S_3$ and $S_4$ might represent the balance selection switches, respectively. In this embodiment, processing unit 16 will determine whether switch $S_1$, $S_2$, $S_3$ or $S_4$ is being selected, and if more than one switch $S_1$, $S_2$, $S_3$ or $S_4$ is selected, then, which of the switch was selected first. Accordingly, the processing unit 16 will issue control commands over line 26 to the MUX control circuit 28. In this particular example, balance control amounts to specific attenuation control for the individual channels. Since balance and volume control are all similar in that both entail making attenuation adjustments to one or more channels, the system must determine which command was received first so that the appropriate attenuation adjustment commands may be made by the processing unit 16 over line 26 to the multiplexer control device 28 of block 200.

When the multiplexer control 28 of block 300 receives a changed volume level indication over line 26 from processing unit 16, it determines what the appropriate logarithmic attenuation should be and what, if any, appropriate change needs to be made. Accordingly, the multiplexer control will activate one of the plurality of lines 32(1) through 32(n) to select the appropriate wiper position of the potentiometer. In one embodiment, the potentiometer will have for example a resistor array having 64 logarithmic steps. Accordingly, there would be 64 multiplexer control lines, namely 32(1) through 32(64).

Once the multiplexer 28 activates a wiper position control line 32(1)-32(n) to produce the desired resistance value in the resistor array of the potentiometer, the desired volume or change in volume is achieved if such device is being used with an amplifier. It is worth noting that in one embodiment of the invention, the processing unit 16 has the ability to "step" the resistance values from the original wiper selection to the final wiper selection, over a given time period to produce a gradual increase in the desired volume so as to avoid instantaneous change, if the change called for is sufficient to justify or require such stepping. This may be desired so as to prevent to rapid a change in volume, for example.

When the multiplexer control device 28 activates one of the plurality of lines 32(1)-32(n), a charge pump 34 in Mux Control 28 provides a voltage level adapted for activating a gate device 36(1)-36(n) by supplying a threshold operating voltage. Thus, the gate device 36(1)-36(n) is activated and provides a connection at that wiper point between the amplifier and output 39. By way of example, if the multiplexer control device 28 activates line 32(2), then charge pump 34 provides a threshold voltage over line 32(2) to gate device 36(2) which in turn establishes a wiper connection over line 37(2) at wiper point 38(2) to output line 39. This charge pump is discussed in more detail in a related application which is being filed concurrently herewith of Ezell, which is entitled "Charge Pump" and which bears attorney docket number 20661/00402, and which is incorporated by referenced herein. A further improvement is the use of a zero crossing detector to act as a "trigger" for the switch. Such a feature is disclosed in a concurrently filed related application of Ezell, which is entitled "Zero Crossing Detector" and which bears attorney docket number 20661/00403 and which is also incorporated by reference herein. Yet another improvement is the use of a logarithmic approach to the resistive cells which is set out in more detail in the copending concurrently filed U.S. patent application of Ezell, which bears attorney docket number 20611/00401 and which is incorporated by reference herein.

Referring now to FIGS. 2 through 6 in combination, there is shown one embodiment of the invention herein as implemented by the inventor.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A semiconductor potentiometer comprising:
   a resistor array having a plurality of selectable wiper points;
   a multiplexer connected to and adapted for selecting said wiper points to create at least one signal path;
   a processing unit connected to and adapted for controlling said multiplexer;
   a plurality of external switches; and
   a plurality of debounce circuits connected therebetween each of said external switches and said processing unit.

2. A method of selecting wiper positions and of creating at least one signal path with respect to a digital potentiometer, comprising the steps of:
   determining whether an increase or decrease in volume for all signal paths has been selected;
   determining whether a decrease in volume has been selected for the signal paths;

determining whether mute has been selected for all of the signal paths;

determining, if more than one selection has been made at the same time, which selection was made first; and controlling a multiplexer to select an appropriate wiper point according to the selections, wherein, if more than one switch is selected at a time, processing unit will control the multiplexer to select wiper points to correspond with the first selection made and ignoring the other selection.

* * * * *